United States Patent
Pace

Patent Number: 5,378,313
Date of Patent: Jan. 3, 1995

[54] HYBRID CIRCUITS AND A METHOD OF MANUFACTURE

[76] Inventor: Benedict G. Pace, 2200 Smithtown Ave., Ronkonkoma, N.Y. 11779

[21] Appl. No.: 171,696

[22] Filed: Dec. 22, 1993

[51] Int. Cl.⁶ .......................... B44C 1/22; C23F 1/00
[52] U.S. Cl. .................... 156/643; 156/644; 156/656; 156/659.1; 156/901
[58] Field of Search .............. 156/643, 644, 645, 656, 156/659.1, 901, 902; 219/121.68, 121.69; 29/846, 852; 427/97

[56] References Cited

U.S. PATENT DOCUMENTS

| | | | |
|---|---|---|---|
| 4,657,778 | 4/1987 | Moran | 156/901 X |
| 5,287,619 | 2/1994 | Smith et al. | 29/852 |
| 5,322,593 | 6/1994 | Hasegawa et al. | 156/633 |

OTHER PUBLICATIONS

Hargis, *Ceramic Multichip Modules (MCM-C)*, Inside ISHM, Mar./Apr. 1993 (vol. 20, No. 2) pp. 15–18.
Danner & Sanow, *Transfer Tape MCM-C*, Inside ISHM, Mar./Apr. 1993 (vol. 20, No. 2) pp. 19–20.

Primary Examiner—William Powell
Attorney, Agent, or Firm—John F. McCormack

[57] ABSTRACT

A method of manufacturing high connectivity ceramic multichip modules (MCM-C) using previously fired ceramic substrates, thick film dielectric layers and laser drilled vias. The laser energy is controlled in proportion to the thickness of the dielectric layer so that vias penetrate through the dielectric layers, but do not penetrate the underlying conductors. To minimize laser damage to the underlying conductors, the dielectric composition comprises fillers or pigments selected to absorb light at the wavelength emitted by the laser.

20 Claims, 2 Drawing Sheets

HYBRID CIRCUITS AND A METHOD OF MANUFACTURE

FIELD OF THE INVENTION

This invention is related to the field of multichip modules and hybrid circuits for electronic interconnections.

BACKGROUND OF THE INVENTION

Multichip modules (MCMs) for electronic interconnections are classified into three types MCM-L, MCM-D and MCM-C. MCM-Ls are produced on organic substrates such as copper clad FR-4, epoxy glass, by multilayer laminate processes. MCM-Ls have the advantages of being available in large volume production at relatively low cost. The disadvantages of MCM-L are moisture sensitivity, low conductor routing density, poor thermal conductivity through the substrate, a high coefficient of thermal expansion compared to the integrated circuits to be mounted on them, and MCM-L is not suitable for a hermetically sealed package.

MCM-D is thin film deposited multichip module on a polished substrate of a ceramic or silicon. Metallization patterns are etched using photolithographic techniques, insulating layers are organic polymers, polyimide or benzenecyclobutane polymers. The vias in the insulating layers are also formed by photolithographic techniques. Manufacturing costs for MCM-D are very high, and have hindered wide use of the technology. The organic insulating layers of the MCM-D limit the temperature range in MCM-D manufacture and use, make the electrical properties sensitive to moisture, and prevent its use in hermetically sealed packages.

MCM-C is ceramic multichip module. MCM-Cs are usually multilayer conductive patterns joined together in a monolithic structure by cofiring. Each layer is formed from a green ceramic tape. The required via pattern is punched or laser drilled in the green tape. The conductive pattern for each layer is printed green tape, and the green tape layers then laminated together and cofired. The major problem of cofired MCM-C is the variation in size due to shrinkage in firing. Large scale electronic equipment manufacturers have successfully compensated for this problem for in-house production of long running part numbers, but shrinkage variation continues to plague the manufacture of MCM-C in small to medium scale production.

The transfer tape modification of the MCM-C process combines standard thick film hybrid circuit techniques with cofired green tape. The substrate is a fired ceramic. A hybrid thick film conductive pattern is printed on the substrate and fired. The required vias are made in the green tape by a laser before laminating the green tape to the fired ceramic substrate. The via diameter can be controlled much better than the via diameter in a conventional screened thick film dielectric layer, but there is a tendency for laser drilled green tape layers to form cracks around the vias.

The minimum via diameter that could be reliably printed and fired with screen printed dielectrics is 0.3 mm (12 mils). Vias printed with smaller diameter vias frequently close up when the screen printed dielectric layer is fired. So there was no method available to use a conventional thick film dielectric and get small diameter vias, i.e. diameters of 0.15 mm (6 mils) down to 25 $\mu$m (1 mil).

In the prior art of hybrid circuits, lasers have been used to form holes through both fired ceramic substrates and through individual green ceramic layers before firing. There is no teaching in the prior art either of hybrid circuits or of MCM-C of a method of manufacturing multilayer circuits wherein vias between previously fired layers are formed by controlling the applied laser energy in proportion to the thickness of the dielectric so that via penetrates through the dielectric to contact the desired metallization layer without penetrating through the metallization layer.

Lasers are used for trimming thick film resistors through a glass seal layer. The cuts in the resistor are made through the glass. The glass of the seal layer does not contain any ceramic component, it is at least partially transparent to the laser, and the glass melts and reflows over the edges of the laser cut so no opening remains from the resistor layer through the glass.

SUMMARY OF THE INVENTION

One embodiment of the invention is a method of forming a conductive pattern on a fired, non-conductive substrate. The conductive pattern has at least two conductive pattern layers.

The method comprising the steps of:
a) Providing a fired, non-conductive substrate.
b) Forming a first, metallic, conductive pattern layer on the substrate.
c) Covering at least a portion of the conductive pattern layer with a fired, inorganic, insulating layer.
d) Removing selected areas of the insulating layer with a laser, forming at least one opening through the insulating layer to selected areas of the conductive pattern layer, the openings not penetrating through the conductive pattern layer.
e) Forming a second, metallic, conductive pattern layer on the fired, inorganic, insulating layer making at least one electrical connection to the first, conductive pattern through the opening.

Another embodiment of the invention is a method of manufacturing a multilayer hybrid conductive pattern on a previously fired, inorganic substrate. In the method a first, conductive pattern layer is formed on the substrate by thick film or thin film techniques; an inorganic, dielectric layer is fired over the conductive pattern layer; and another, second, conductive pattern layer is formed on the dielectric layer. The second, conductive pattern layer is connected to the first, conductive pattern layer by means of conductor filled vias in the dielectric layer. The vias in the dielectric layer are formed by a process of laser ablation, wherein the thickness of the dielectric layer and the laser energy are controlled in proportion to each other. The laser energy must be sufficient to ablate a via through the dielectric layer to the conductive pattern, but not so great that it would remove the metal of the conductive pattern underneath the via. The thickness of the dielectric layer must be sufficient to provide insulation between conductive pattern layers, but less than that which would require laser energy for via ablation that would destroy the portion of the metal of the conductive pattern layer underlying the via.

DETAILED DESCRIPTION OF THE INVENTION

Figure 1:
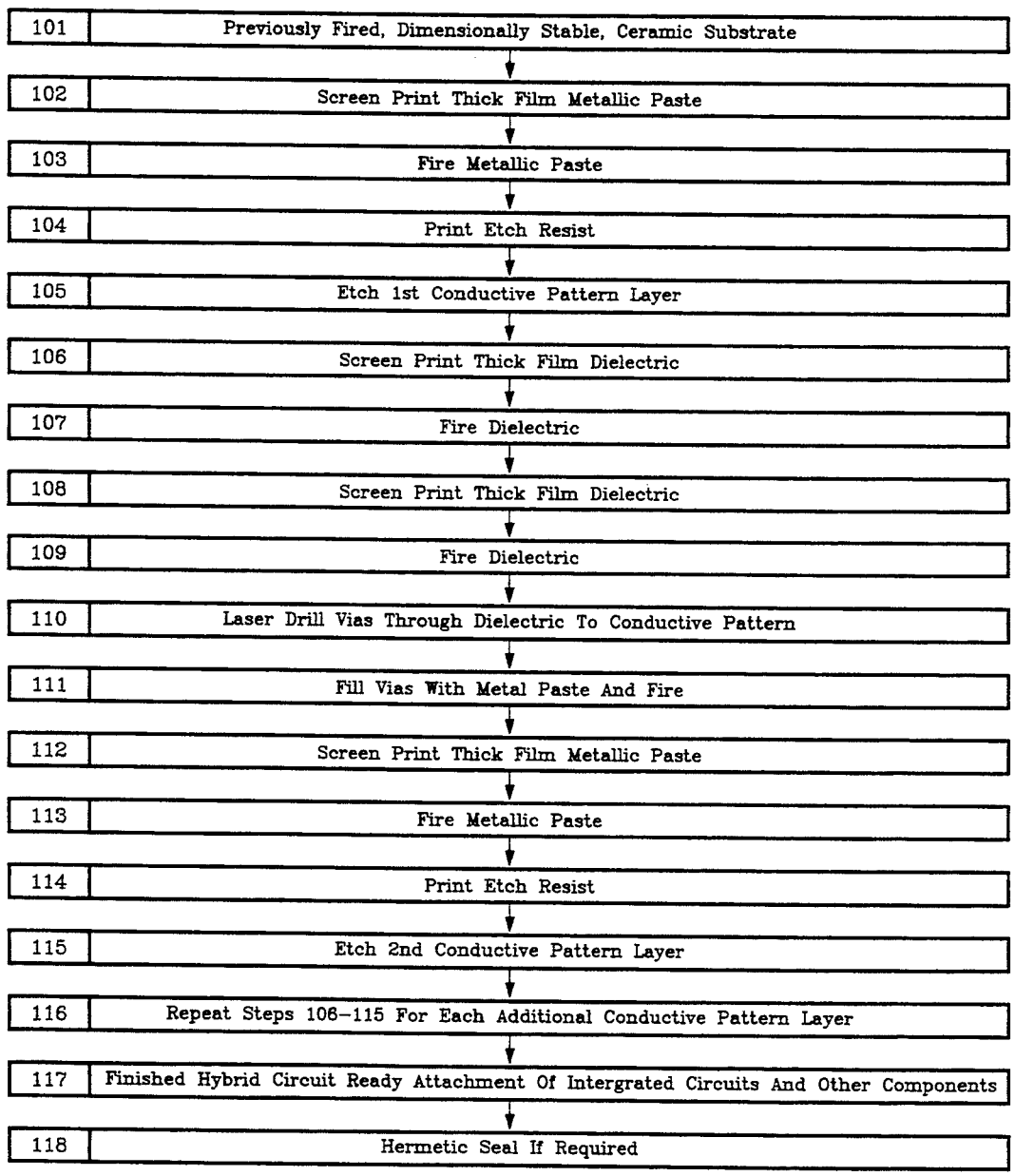
FIG. 1 is a flow chart for a process to manufacture a multilayer hybrid circuit according to the method of this invention.

According to the present invention hybrid circuits and ceramic multichip modules (MCM-C) are manufactured on previously fired, ceramic substrates using conventional, thick film, dielectric insulation between conductive pattern layers. Vias are formed through the dielectric insulation to the underlying conductive pattern layer by laser ablation. The thickness of the dielectric insulation is controlled and the laser energy is moderated in proportion to the thickness and composition of the dielectric layer so that the energy is sufficient to ablate the via through the insulation, but less than the energy that would ablate a substantial part of the portion of the conductive pattern layer beneath the via.

The laser vias can be formed with a diameter of 25–125 $\mu$m (1–5 mils). A 25 $\mu$m via is an order of magnitude smaller than conventional, thick film, hybrid vias. This invention makes possible the formation of high conductor density MCM-Cs using conventional, thick film, hybrid equipment and techniques. The thick film manufacturing process is simplified, since no via pattern, film masters or via screen patterns need be prepared for the dielectric layer. The via pattern is in the software driving the laser; it is simply installed and can be easily modified when the circuit requirements change. The via positioning is precise since the previously fired substrate does not shrink, nor does a fired dielectric layer.

The absence of shrinkage, the simplified manufacturing process, the ease of making via pattern changes, and the use of conventional thick film, hybrid techniques provide an improved method to manufacture MCM-Cs in short runs and for quick turn around.

The previously fired ceramic substrates useful in the practice of this invention include conventional hybrid circuit substrates, both thick film and thin film substrates such as 96% alumina, 99% alumina, mullite, aluminum nitride, beryllia, boron nitride, silicon carbide and silicon. The process of the invention also may be utilized to modify the conductive pattern of circuitized substrates such as cofired MCM-C and transfer tape MCM-C.

The conductive pattern layers of this invention may be formed by either thick film or thin film processes. Thick film conductive patterns may be screen printed using gold, platinum/palladium/gold, platinum/palladium, silver bearing or copper pastes. For higher resolution conductive pattern layers (conductor lines and insulating spaces as low as 60 $\mu$m or 2.5 mils) a solid, thick film metal conductor layer may be applied; then a photoresist is applied, exposed and developed to print the conductive pattern with photoresist. The unprotected parts of the solid metal conductor layer are etched away and the photoresist removed to produce the conductive pattern layer. It is preferred to etch a conductive pattern layer when the conductive pattern has conductor lines and spaces less than 0.13 mm.

In conventional thick film processing conductive pattern layers are screen printed. After firing the tops of the screen printed conductors are rounded. It is more difficult to wire bond to a rounded surface, and a large wire bonding pad is preferred to compensate for the rounding. When a solid thick film conductor layer is printed with photoresist and etched to form the conductive pattern, the tops of the conductors are flat and the wire bonding pads can be smaller.

For the highest resolution (lines and spaces less than 50 $\mu$m or 2 mils) thin film conductive layers are applied, printed with photoresist and etched. Commercially available, premetallized, thin film substrates may be printed and etched to form the first conductive pattern layer. Subsequent thin film metal conductor layers may be applied over the fired thick film dielectric layer after laser formation of the vias. A suitable metal bonding layer such as titanium/tungsten, chromium or molybdenum/manganese is applied followed by a metal conductor layer such as gold, copper or aluminum. It is possible to make all the internal conductive pattern layers of a highly conductive metal which will withstand the firing of the dielectric, such as gold or copper, while the top conductive pattern layer could be made of aluminum for improved aluminum wire bonds to the integrated circuits.

The conductive pattern of the hybrid circuits or MCM-Cs, prepared according to this invention, may include thick film or thin film resistors. The resistors may be incorporated into one or more of the metal conductive pattern layers, or the resistors may be situated on one or more separate conductive pattern layers connected to other layers by conductive vias.

The dielectric layer is formed over a conductive pattern layer by applying a coating of inorganic dielectric materials dispersed in an organic vehicle, and firing the coating to burn off the vehicle and fuse the inorganic materials into an adherent film. After firing the dielectric must be capable of maintaining its shape without reflow after laser ablation or after firing of subsequent layers. Conventional thick film dielectric pastes may be used. The dielectric coating may be applied by screen printing, roller coating, spin coating, as a predried tape or any suitable technique that will apply a uniform film of sufficient thickness. Conventionally, to avoid pinholes, at least two applications of a dielectric coating are made for each dielectric layer, and each coating application is fired individually before the next application.

The overall thickness of the dielectric layer must be controlled. If the dielectric layer is too thick, it is difficult to apply sufficient laser energy to ablate a via in the dielectric in a reasonable period of time, and to avoid ablating all the way through the metal conductor underneath the via. In order to obtain a reasonable production rate, the time to position the laser beam on a via site and ablate a via should be one second or less. To achieve a reasonable production rate using a ceramic filled glass dielectric, the overall thickness of the dielectric layer should be less than 50 $\mu$m (2 mils), preferably less than 40 $\mu$m (1.6 mils), and more preferably less than 30 $\mu$m (1.2 mils). The maximum dielectric thickness is most critical if the metal conductor layer underneath the via is a thick film conductor, since excess laser power would ablate the metal layer and leave a void or an "open" in the conductive pattern. It is less critical if the metal conductor layer is a thin film conductor since excess laser power might ablate away the conductive metal but not the refractory bonding layer, e.g. titanium/tungsten. Such a hole in the conductive pattern would not be open but would be a resistive connection which might be healed by filling the via with metal.

The minimum dielectric thickness must be sufficient to establish electrical isolation between conductive pattern layers. Preferably the dielectric layer will be at least 10 μm (0.4 mils) thick, and more preferably at least 20 μm thick.

Overall dielectric thickness variations must be minimal to ensure reliable, reproducible laser via formation. Preferably the dielectric thickness over the underlying conductors will vary less than 10%, more preferably the thickness will vary less than 5%, and most preferably the dielectric thickness over the underlying conductors will vary less than 2%.

After firing, the dielectric must be capable of maintaining its shape without reflow after laser ablation or after firing of subsequent layers. Preferably the dielectric is a ceramic filled glass. The dielectric may be colored or pigmented. Most preferably the pigment or the ceramic filler is selected to absorb the laser energy. When the laser is a conventional, resistor trimmer laser, energy absorbing fillers or pigments are incorporated in the dielectric paste.

When a specific laser apparatus is employed, an empirical screening technique may be used to test the suitability of commercially available dielectric pastes for use with the laser to produce vias according to the method of this invention. In one such empirical screening technique a paste is selected as follows:

1. A gold layer is formed on a substrate such as 96% alumina by screen printing and firing a thick film gold paste,
2. A layer of the dielectric to be tested is applied over the gold layer. Two or three prints and firings are made of the dielectric paste to produce a uniform dielectric layer of the required thickness.
3. The laser is set to low power and low pulse rate, and an attempt is made to form a via through the dielectric layer with the laser beam.
4. If the laser beam is reflected, or does not penetrate the dielectric layer suitably, the laser power is incremented slowly until the dielectric layer is penetrated.
5. The suitability of the dielectric composition is determined by inspecting the laser ablated via, the area of dielectric layer surrounding the via and the underlying gold conductor.

Dielectric compositions containing ceramic fillers or pigments which absorb the laser energy form clean vias through the dielectric layer with minimum damage or penetration of the underlying gold layer. The failure of some dielectric compositions which do absorb the laser energy occurs because the laser beam cannot be adjusted to form a clean via; the composition melts and partially reflows over the underlying gold exposed by the laser beam. The failure of other dielectric compositions which do not contain fillers or pigments to efficiently absorb the laser beam occurs because the laser energy required to penetrate the dielectric is too high, and either the resulting via penetrates completely through the gold layer, or the area of the dielectric layer near the via is cracked, burned or blistered, or the via is surrounded by an elevated ridge.

Suitable lasers that may be used to ablate the vias in the dielectric layers include $CO_2$, YAG and eximer lasers. The laser should have sufficient power to rapidly ablate a via in the dielectric. The frequency of the laser beam must be such that the laser energy is absorbed by the dielectric and preferably substantially reflected by the metal conductor. The laser should be capable of being focused to produce a via from 25 μm to 0.25 mm (1–10 mils) in diameter. The laser should have a control capable of storing the required via positions; of rapidly positioning the laser beam on a via site; and of modulating the laser energy on a via site in proportion to the thickness and composition of the dielectric layer. Conventional resistor trimmer lasers can be used to ablate the vias in the dielectric layer.

A typical process for the manufacture of a high density hybrid circuit of an MCM-C according to this invention is shown as a flow chart in FIG. 1. The starting material 101 for the process may be a conventional, thick film or thin film, ceramic substrate, such as alumina, mullite, beryllia, aluminum nitride, boron nitride, silicon carbide, and the like. Since the ceramic substrate according to this invention is already fired, the problem of shrinkage, a major problem when firing green ceramics as in cofired MCM-C, does not exist.

As shown in FIG. 1, 102, 103, 104 and 105, the first step in the process of the invention is to form a first metallic conductive pattern layer on the ceramic substrate. If the conductor density in the first conductive pattern layer is low, the first conductive pattern may be directly screen printed and fired, and the operations labeled 104 and 105 omitted.

It is difficult to reliably reproduce directly screen printed and fired conductive patterns when the conductor density requires lines and spaces lower than 0.13 mm (5 mils). If the first conductive pattern requires conductor lines and spaces lower than 0.2 mm (8 mils) down to conductor lines and insulating spaces as low as 60 μm (2.5 mils) it is preferred to carry out the process sequence outlined in FIG. 1, 102, 103, 104 and 105. In 102 a layer of thick film, metallic paste is applied over at least one surface plane of the ceramic substrate. The paste layer may cover the complete planar surface, or only a portion of the surface where metallic conductors are required. Next 103 the paste on the substrate is fired to convert it to a metallic layer. In the process step labeled 104 an etch resistant image of the desired first conductive pattern layer is printed over the metallic, conductive layer. Commercially available, photoimageable, etch resists can be used. The portion of the metallic, conductive layer not covered by resist is etched away, 105, and the etch resist is stripped.

When the first conductive pattern layer requires conductor lines and spaces less than 60 μm wide, it is preferable to use thin film metallization in place of the thick film metallization shown as process steps labeled 102 and 103. Premetallized substrates are commercially available, which would combine flow sheet steps 101, 102 and 103. The thin film metallized substrates are likewise printed 104 and etched 105 to form the first, conductive pattern layer.

After formation of the first, conductive pattern layer, a dielectric layer is applied. FIG. 1, 106, 107, 108 and 109 outline the application and firing of the dielectric using readily available thick film processing equipment. The process is simpler than conventional thick film dielectric screen printing since no dielectric vias are printed, there is no screen pattern required, and no necessity for precise registration of a screen via image to an underlying conductor. In order to avoid pinholes in the dielectric layer at least two prints and firings are used. Additional prints and firings may be used as long as the overall thickness of the dielectric layer is not so great that the laser energy required to form a via would damage or destroy the underlying conductor.

Following the formation of the dielectric layer, the vias are formed with a laser 110. The laser energy is controlled to prevent damage or destruction of the underlying conductors. The quantity of laser energy required, which varies with the composition and thickness of the dielectric layer, can be determined empirically. No via artmaster is required. The X-Y coordinates of the vias are fed to the laser controller.

Via filling, as shown in FIG. 1, 111, is optional. It is not required in all cases. Filling the vias will serve to provide a more level surface for subsequent printing processes when small pads are required in the conductive pattern layers.

The normal surface roughness of the screen printed thick film dielectric can be reduced by lapping, polishing or mechanically abrading the high spots to level or smooth the surface of the dielectric before applying the next metallization layer. The smoother surface will permit etching of finer conductors and finer conductor pitch in the overlying conductor pattern layer. It is preferred to polish the surface of the dielectric if the subsequent conductive pattern layer will have conductors with widths of about 50 $\mu$m (2 mil) or less.

The second conductive pattern layer is applied in the same manner as the first, as shown in FIG. 1, 112, 113, 114 and 115. Alternatively, a refractive metal bonding layer, e.g. titanium/tungsten, and a deposited conductor, e.g., copper, gold or aluminum, can be substituted for the thick film metal layer produced in 112 and 113.

The above steps of forming a dielectric layer, creating vias to underlying conductive pattern, and forming a conductive pattern layer overlying the dielectric layer are repeated for each subsequent conductive pattern layer as is indicated in FIG. 1, 116. Each conductive pattern layer overlying a dielectric layer is electrically connected through the vias to the conductive pattern layer underlying the dielectric layer.

After completion of the final conductive pattern layer, the MCM-C is ready for mounting of the integrated circuits and any discrete components, as shown in 117.

In FIG. 1, 118, after the components are mounted on the MCM-C, a hermetic seal is applied if it is required.

Figure 2:
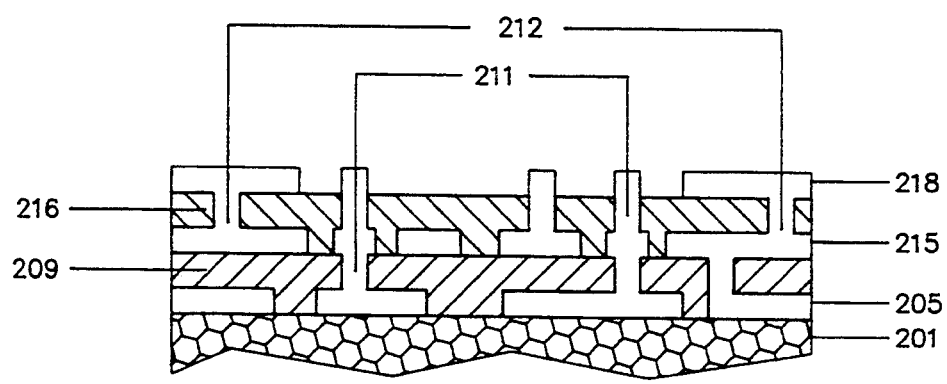
FIG. 2 is a cross-sectional view of a multilayer, hybrid circuit prepared according to the process of this invention.

FIG. 2 is a cross-sectional view of a multilayer hybrid or MCM-C that has been prepared by this process. The ceramic substrate 201 has a first conductive pattern layer 205. The first dielectric layer 209, which covers the first conductive pattern layer, is pierced by laser ablated, metal filled vias 211. A second conductive pattern layer 215 is situated upon the first dielectric layer. The second dielectric layer 216 overlies the second conductive pattern; the second dielectric layer is also penetrated by laser ablated, metal filled vias 211 and 212. A third conductive pattern layer 218 is on the surface above the second dielectric layer. Metal filled vias 211 and 212 make connection from the underlying conductive pattern layers to the surface conductive pattern layer 218.

The invention will be further described by the examples below.

EXAMPLE 1

Multilayer hybrid conductive patterns were prepared on 96% alumina substrates, 50 mm×50 mm (2 inch×2 inch) square, supplied by Coors Ceramics Company.

A thick film gold paste was screen printed over one entire surface of each substrate. A 325 mesh stainless steel screen was used. The thick film gold paste was 88% gold, 3-4% glass with 8-9% organic binder of ethyl cellulose and terpineol. The thick film prints were fired at a temperature of 850° C. for 8-10 minutes which provided a gold film 12-14 $\mu$m thick on the alumina substrates.

A dielectric paste was selected which would effectively absorb the laser energy. A resistor trimmer laser was selected which emitted a laser beam in the near infrared at a wavelength of 1064 nm. The dielectric composition selected absorbed energy in the near infrared. After firing the dielectric was blue, and is believed to contain a cobalt aluminate or cobalt silicate pigment.

Two layers of the blue, thick film, ceramic loaded, glass dielectric (CERMALLOY IP-9117 TM commercially available from Heraeus Inc., West Conshohocken, Pa. 19428) were printed over the gold layer using a 325 mesh screen. Before printing the Cermalloy IP-9117 paste was diluted with terpineol to give low viscosity and better leveling of the dielectric layer. After each layer was printed it was fired in accordance with the manufacturer's instructions. After firing the total dielectric thickness was 25 $\mu$m.

On a first group of the substrates the dielectric layer was left intact and on a second group three mil vias (diameter of 75-100 $\mu$m) were formed through the dielectric to the gold layer underneath. The vias were formed using a YAG laser manufactured by Control Laser Corp. (available from Electro Scientific Industries, Inc., Portland, Oreg. as Model ESI 44 TM). The laser energy was adjusted in proportion to the thickness of the dielectric layer, by varying the power, the pulse rate and the laser positioning velocity, so that the laser energy was sufficient to make a via in the dielectric, but not so great as to remove any significant portion of the gold underneath the via. The power was adjusted in the lower power levels available on the Model ESI 44. After testing pulse rates between 500 and 1500 per second, the pulse rate was set at 1000/sec. The laser spot, approximately 25 $\mu$m in diameter, was stepped twice in 10 $\mu$m steps in two concentric circles around the each 75 $\mu$m via site. One of the concentric circles ablated the dielectric composition at the circumference of each via site, and the other ablated the dielectric composition in the interior of each via site.

The vias obtained were clean, circular openings to the gold layer underneath.

On both groups of substrates a second gold layer was printed over the dielectric. The thick film gold paste used for the first layer was diluted with terpineol to reduce the viscosity of the paste and enhance the leveling of the print. On the second group of substrates the gold paste filled the vias making contact to the first gold layer underneath. The gold paste was 77-78% gold which produced a gold film 7-8 $\mu$m thick after firing.

On the first group of substrates a second dielectric layer was applied over the second gold layer in the same manner as before. This provided a gold layer insulated on both sides with a thick film dielectric. Vias were formed in the second dielectric layer with the laser as described above. This exposed portions of the second gold layer underneath the vias. Surprisingly even though the second gold layer was thermally suspended in the dielectric layers, with no heat sinking to the alumina substrate, the heat of the laser via formation neither caused microcracking of the dielectric or of the metal layers, loss of adhesion between the dielectric and gold layers, nor failure of the insulation between the two gold layers.

The gold layer of the second group of substrates was spin coated with photoresist (AZ 4210 ™ available from American Hoechst, Branchberg, N.J.), exposed through a test pattern, and developed (AZ 400K ™ Developer). The test pattern provided a resist image having 75 μm (3 mil) lines and spaces. The portion of the gold layer not covered with resist image was etched away with an aqueous potassium iodide and iodine etchant (CGE-100 ™ available from Micro Pac Co., Garland, Tex.). The resist image was removed leaving a gold conductive pattern on the surface. Selected portions of the pattern had 75 μm (3 mil) conductive lines and insulating spaces, and other selected portions of the gold conductive pattern were electrically connected to the first gold layer through the vias.

EXAMPLE 2

A substrate is provided with a gold layer as in Example 1. A test is made to establish the proportion between the laser energy and the thickness of the dielectric layer. A dielectric layer 75 μm (3 mils) thick is applied over the gold layer in two prints firing the dielectric after each print. The dielectric paste is DuPont 9429 ™ which is believed to contain zirconia and alumina as ceramic fillers. After firing the dielectric layer is cream colored or off-white in color. The resistor trimmer laser used in Example 1 is tested for its ability to create vias in the dielectric. When the laser is used at lower power levels it is unable to efficiently penetrate the dielectric and form a via. The power level is increased and the power level which penetrates the dielectric layer and form a via also destroys the underlying gold conductor.

A second substrate provided with a gold conductor layer as in Example 1 is coated with a dielectric layer 25 μm (1 mil) thick. The dielectric is the same DuPont composition and is applied in two prints firing after each print. The laser is again tested for its ability to create vias in the dielectric. The laser is now able to penetrate through the dielectric at lower power levels and form clean vias without destroying the underlying conductor.

EXAMPLE 3

A substrate is coated with a thick film gold paste as in Example 1. After firing the gold paste, a conductive pattern layer, resist image is printed over the gold layer. The conductive pattern layer is formed by etching the gold layer using a potassium iodide/iodine etchant. After removing the resist a dielectric layer is applied in two steps, firing after each step, as in Example 1. The surface of the dielectric layer is polished using Buehler ™ polishing wheel. Three mil vias down to the gold layer are formed in the dielectric layer as in Example 1.

In order to form a smoother surface for photoprinting fine lines over the vias, the vias are filled with a low viscosity thick film gold paste (77–78% gold) using a rubber squeegee to fill the vias and wipe the excess gold paste from the surface of the dielectric. The substrate and the gold paste in the vias is fired. The low viscosity thick film gold paste is then screen printed over the dielectric and the gold filled vias. A smooth surface for photoprinting is obtained after firing. A photoresist image is formed by the procedures used in Example 1. The image over the vias is clear and sharp. The portion of the gold surface unprotected by the resist image is etched away, as in Example 1. The gold pattern after etching resolves 50 μm lines and spaces.

EXAMPLE 4

A thin film multilayer hybrid circuit was prepared using thick film dielectric between conductive layers and laser formed vias through the dielectric for interconnecting the conductor layers.

The substrates were 99% alumina provided with a Ti/W bonding layer plus 2.5 μm (100 microinch) of gold as a metallization layer (MRC SUPERSTRATE ™). A thick film dielectric layer was formed over the metallization layer by screen printing a thick film dielectric paste (CERMALLOY 9117 diluted with terpinol as in Example 1) on the substrate, firing in air, and again screen printing the dielectric paste over the previously fired dielectric and again firing the substrate in air. On some of the substrates the surface of the dielectric layer was polished to obtain a smoother surface finishing before further processing.

A laser was used to form vias through the dielectric layer to the metallization layer as in Example 1, except that the vias were only 50–75 μm in diameter.

A second metallization layer of Ti/W and 1 μm (40 microinch) gold was applied over the dielectric surface of substrates by standard vacuum deposition techniques. The adhesion of the first metallization layer to alumina base and to the dielectric layer was excellent even after firing the dielectric in air and after laser via formation. Likewise the adhesion of the second metallization layer to the dielectric layer was excellent. Also the electrical connection through the vias from the second metallization layer to the first metallization layer was excellent.

A photoresist image was formed on the substrates as in Example 1, except that the test pattern used had areas with 25 μm (1 mil) lines and spaces. The metallization not protected by the resist image was etched away using a potassium iodide and iodine solution to remove the gold, and 35% hydrogen peroxide at 40° C. to remove tungsten. After the resist was stripped it was fount that the 25 μm line and space portions of the patterns had been resolved on both the unpolished and polished dielectric layers. However, the edges of the gold conductors over the polished dielectric surface were more sharply defined.

Integrated circuits were connected to the gold conductive pattern by wire bonds. Adhesion of the wire bonds to the metallization and of the metallization to the dielectric was

EXAMPLE 5

A conventional, multilayer, thick film hybrid circuit was selected to be redesigned for manufacture by the method of this invention. The hybrid circuit interconnects four LSI chips, and when manufactured by the conventional thick film process, it had 11 screen printed, thick film, conductive pattern layers. The conductor lines and pitch were 0.25 mm (10 mils), and the pads for interconnection between conductive pattern layers were 0.4 mm (16 mils). In the redesign the conductor lines and conductor pitch of the internal conductive pattern layers were reduced to 0.1 mm (4 mils), and the pads for interconnection between conductive pattern layers were also 0.1 mm (4 mils). This reduction in line width and spacing resulted in only two internal conductive pattern layers replacing the 10 internal conductive pattern layers of the conventional thick film design.

The redesigned, multilayer, hybrid circuit was made on an alumina substrate, 51 mm×51 mm (2 inch by 2 inch). As in Example 1, a layer of thick film gold paste was screen printed on the substrate. The thick film gold paste was printed as a square 35 mm×35 mm (1.4 inch×1.4 inch) in the center of the substrate. After firing the gold paste on the substrate, a photoresist was coated over the gold layer. A photoresist image with 0.1 mm lines and spaces corresponding to the conductive pattern of the first layer of the redesigned hybrid circuit was printed and developed on the gold layer as in Example 1. The gold not protected by the resist image was etched away as in Example 1. The photoresist was stripped off leaving a gold conductive pattern having 0.1 mm lines and spaces.

A contact pattern was printed around the perimeter of gold conductive pattern using a platinum/gold paste. The screen printed contacts, which were 35 mils (0.89 mm) wide and 100 mils (2.54 mm) long, were printed on 50 mil centers (1.25 mm) and slightly overlapped selected conductors of the gold conductive pattern. After firing the platinum/gold contacts were approximately 13 $\mu$m (0.5 mil) thick. The platinum/gold contacts were also formed in the same way on the reverse side of the alumina substrate.

A thick film dielectric paste was screen printed over the gold conductive pattern as a 35 mm×35 mm square. After firing the dielectric composition was approximately 7-8 $\mu$m thick. The dielectric paste was printed and fired two more times to give a dielectric layer approximately 25 $\mu$m thick.

The surface of the dielectric layer was lapped with 3 $\mu$m diamond powder in water to provide a smooth base for the next conductive pattern layer.

Using the same laser as Example 1, a test via was drilled through the dielectric layer to confirm the control settings for power and pulse rate. The via diameter was approximately 75–85 $\mu$m (3–3.5 mils). The laser spot, approximately 30 $\mu$m in diameter was stepped in 10 $\mu$m steps in a spiral pattern starting at the circumference of the 75–85 $\mu$m via and ending in the center of the via. The remaining vias were drilled following the same procedure. No via artmaster was required, since all the via positions were computed by the design software which was used to drive the laser. The precision of via positioning was ±5 $\mu$m.

A second layer of gold paste was printed and fired over the dielectric layer to make a second 35 mm×35 mm gold square. The gold filled the vias making contact to the first gold conductive pattern layer. The second gold conductive pattern layer was formed from the second gold layer by the photolithographic technique described above.

A second dielectric layer was formed over the second conductive pattern layer by the procedure described above. After laser drilling a test via to determine the settings, laser ablated vias, 75–85 $\mu$m diameter, were drilled through the second dielectric layer to the second conductive pattern layer below.

A third conductive pattern layer was screen printed and fired over the second dielectric layer using a gold thick film paste. The screen printed conductors were 0.19 mm (7.5 mils) wide, and the minimum conductor pitch was 0.19 mm. The gold film from the third conductive pattern layer filled the vias in the second dielectric layer making connections to the second conductive pattern layer below.

A thick film dielectric paste was screen printed and fired to form a dielectric pattern layer over the third conductive pattern layer. The dielectric pattern covered and insulated those conductors where a wire would cross over the conductor.

The perimeter of the alumina substrate outside the platinum/gold contacts was cut away with a diamond saw. Clip on leads were fastened on to connect the top and bottom contacts. Four LSI chips were placed on the top and connected to the third conductive pattern layer with 80 wire bonds, and a 35 mm×35 mm epoxy frame was adhesively bonded in place to protect the circuit.

The conductive pattern was completed in three layers using more than 1300 laser ablated vias. The finished hybrid circuit successfully replaced the conventional, thick film hybrid, which not only had 11 conductive pattern layers and 11 dielectric pattern layers, but also required additional dielectric layers printed on the back to balance the stress of the pattern layers and prevent bowing of the substrate.

I claim:

1. A method of forming a conductive pattern on a fired, non-conductive substrate, the conductive pattern having at least two conductive pattern layers, the method comprising the steps of:
   a) providing a fired, non-conductive substrate;
   b) forming a first, metallic, conductive pattern layer on the substrate;
   c) covering at least a portion of the conductive pattern layer with a fired, inorganic, insulating layer;
   d) removing selected areas of the insulating layer with a laser, forming at least one opening through the insulating layer to selected areas of the conductive pattern layer, the openings not penetrating through the conductive pattern layer, and
   e) forming a second, metallic, conductive pattern layer on the fired, inorganic, insulating layer making at least one electrical connection to the first, conductive pattern through the opening.

2. A method of claim 1, wherein at least one of the conductive pattern layers is formed by photolithography, and the minimum conductor line width is less than 0.13 mm or minimum insulating spaces between conductors is less than 0.13 mm.

3. A method of claim 2, wherein at least some of the openings in the inorganic, insulating layer have diameters less than the minimum conductor line widths.

4. A method according to claim 3, wherein the inorganic, insulating layer is less than 40 $\mu$m and more than 10 $\mu$m thick.

5. A method according to claim 4, wherein the inorganic, insulating layer is less than 30 $\mu$m and more than 20 $\mu$m thick.

6. A method according to claim 5, wherein the minimum conductor line width or minimum spacing between conductors is 0.1 mm.

7. A method according to claim 6, wherein at least one conductor layer is metallized by a sputtering process.

8. A method according to claim 6, wherein prior to applying a subsequent conductive pattern layer, at least one underlying, inorganic, insulating layer is abraded to level the surface.

9. A method according to claim 8, wherein the layer is abraded by lapping.

10. A method according to claim 9, wherein the layer is abraded by polishing.

11. The method according to claim 4, wherein the inorganic, insulating layer comprises a filler or pigment which absorbs light energy at the wavelength emitted by the laser.

12. The method according to claim 11, wherein the laser is a YAG laser.

13. The method according to claim 11, wherein the laser emits light with a wavelength in the near infrared.

14. In a method of manufacturing a multilayer hybrid conductive pattern on a previously fired, inorganic substrate, the multilayer hybrid conductive pattern having at least two conductive pattern layers and a dielectric layer between the conductive pattern layers, wherein at least one, first, conductive pattern layer is formed on the substrate by thick film or thin film techniques; an inorganic, dielectric layer is fired over the conductive pattern layer; and another, second, conductive pattern layer is formed on the dielectric layer, the second, conductive pattern layer being connected to the first conductive pattern layer by means of conductor filled vias in the dielectric layer, the improvement comprising:

forming the vias in the dielectric layer by a process of laser ablation, wherein the thickness of the dielectric layer and the laser energy are controlled in proportion to each other, the laser energy being sufficient to ablate a via through the dielectric layer to the conductive pattern, and less than that which would remove the metal of the conductive pattern underneath the via, and the thickness of the dielectric layer being sufficient to provide insulation between conductive pattern layers, and less than that which would require laser energy for via ablation that would destroy the portion of the metal of the conductive pattern layer underlying the via.

15. The method of claim 14, wherein the multilayer hybrid conductive pattern is an MCM-C comprising a plurality of conductive pattern layers separated by dielectric layers, the conductive pattern layers being interconnected by laser ablated vias.

16. The method of claim 15, wherein the dielectric layer(s) comprise glass and at least one filler selected to be capable of absorbing radiant energy at the frequency of the laser emission.

17. The method of claim 16, wherein the filler comprises a ceramic oxide selected from the group consisting of aluminum and zirconium oxides.

18. The method of claim 16, wherein the filler comprises a pigment.

19. The method of claim 18, wherein the pigment in the dielectric layer comprises a cobalt compound.

20. A method of manufacturing a ceramic, multichip module comprising:
   a) providing a previously fired ceramic substrate;
   b) screen printing a thick film, metal conductor paste over at least a portion of at least one surface of the substrate;
   c) firing the paste on the substrate producing a first metal layer on the substrate;
   d) printing and etching the metal layer forming a first conductive pattern layer by photolithographic processing, the first conductive pattern layer having minimum conductor widths of 0.1 mm or less;
   e) screen printing a thick film, dielectric paste over at least a portion of the first conductive pattern layer, and firing the dielectric paste on the conductive pattern layer;
   f) repeating the screen printing and firing of the dielectric paste at least once, forming a pinhole free dielectric layer over the portion of the first conductive pattern layer;
   g) smoothing the surface of the dielectric layer by an abrasion process;
   h) forming openings through the dielectric layer to the first conductive pattern layer by laser ablation, the laser emitting light energy in the near infrared, and the laser pulse rate and power being adjusted in proportion to the thickness of the dielectric layer and less than the pulse rate and power which would destroy the portion of the conductive pattern layer underlying the openings, the openings having a diameter less than the minimum conductor width, the openings being formed in predetermined sites for making connections between the first conductive pattern layer and a second conductive pattern layer;
   i) screen printing a thick film, metal conductor paste over at least a portion of the surface of the dielectric layer, and filling the openings with thick film, metal conductor paste;
   j) firing the paste on the dielectric layer producing a second metal layer over the dielectric layer, the second metal layer being electrically connected to the first conductive pattern layer through the openings, and
   k) printing and etching the metal layer forming the second conductive pattern layer by photolithographic processing, the second conductive pattern layer having minimum conductor widths of 0.1 mm or less and interconnected to the first conductive pattern layer at predetermined sites through the openings.

* * * * *